(12) United States Patent
Denzinger et al.

(10) Patent No.: US 6,670,092 B2
(45) Date of Patent: Dec. 30, 2003

(54) RADIATION-SENSITIVE RECORDING MATERIAL HAVING AN ELECTRICALLY CONDUCTIVE BACK COATING

(75) Inventors: Steffen Denzinger, Mainz (DE); Michael Dörr, Mainz (DE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 10/087,354

(22) Filed: Mar. 1, 2002

(65) Prior Publication Data

US 2002/0182533 A1 Dec. 5, 2002

(30) Foreign Application Priority Data

Mar. 6, 2001 (DE) .......................... 101 10 728

(51) Int. Cl.$^7$ ..................... G03C 1/835; G03C 1/77; G03F 7/14; G03F 7/09; G03F 7/11
(52) U.S. Cl. ................... 430/264; 430/204; 430/271.1; 430/276.1; 430/278.1; 430/302; 430/525; 430/527; 430/528; 430/529; 430/530
(58) Field of Search ................. 430/527–530, 430/525, 204, 271.1, 276.1, 278.1, 302, 264

(56) References Cited

U.S. PATENT DOCUMENTS

| | | | |
|---|---|---|---|
| 3,235,384 A | 2/1966 | Neugebauer et al. ........... 96/33 |
| 4,294,739 A | * 10/1981 | Upson et al. ................ 430/527 |
| 4,544,622 A | * 10/1985 | Kausch .................... 430/278.1 |
| 4,563,410 A | 1/1986 | De Jaeger et al. ........... 430/204 |
| 4,617,239 A | 10/1986 | Maruyama et al. .......... 428/452 |
| 5,354,613 A | * 10/1994 | Quintens et al. ............. 430/527 |
| 5,480,762 A | 1/1996 | Toyama et al. ............. 430/302 |
| 5,645,971 A | * 7/1997 | Van Rompuy et al. ...... 430/204 |
| 5,976,776 A | * 11/1999 | Nair et al. .................. 430/527 |
| 6,030,712 A | * 2/2000 | Notsu et al. .............. 430/271.1 |
| 6,110,642 A | 8/2000 | Naruse et al. ........... 430/273.1 |
| 6,162,596 A | * 12/2000 | Schwark et al. ............. 430/527 |
| 6,168,911 B1 | * 1/2001 | Lelental et al. ............. 430/527 |
| 6,187,507 B1 | * 2/2001 | Gates et al. ............. 430/271.1 |
| 6,294,298 B1 | 9/2001 | Denzinger et al. ............. 430/49 |
| 6,294,311 B1 | * 9/2001 | Shimazu et al. ......... 430/271.1 |
| 6,420,081 B1 | * 7/2002 | Elsasser et al. ............. 430/525 |

FOREIGN PATENT DOCUMENTS

| | | |
|---|---|---|
| DE | 19908529 | 8/2000 |
| EP | 410 500 | 7/1990 |
| EP | 0 509 523 | 4/1992 |
| EP | 490515 | 6/1992 |
| EP | 528 395 | 8/1992 |
| EP | 717 317 | 12/1995 |
| EP | 900 653 | 9/1998 |
| EP | 883028 | 12/1998 |
| EP | 0 987 104 | 9/1999 |
| EP | 1 031 881 | 2/2000 |
| EP | 1 147 886 | 4/2001 |
| JP | 02040657 | 2/1990 |
| JP | 06202312 | 7/1994 |
| JP | 09265176 | 10/1997 |

* cited by examiner

Primary Examiner—Richard L. Schilling
(74) Attorney, Agent, or Firm—Connolly Bove Lodge & Hutz LLP

(57) ABSTRACT

The invention relates to a recording material for the production of offset printing plates having a web- or plate-form support, a radiation-sensitive layer on the front of the support and a continuous layer on its back. The back layer has a glass transition temperature Tg of at least 55° C. and a surface resistance of $10^6 \Omega$ or less.

19 Claims, No Drawings

RADIATION-SENSITIVE RECORDING MATERIAL HAVING AN ELECTRICALLY CONDUCTIVE BACK COATING

FIELD OF THE INVENTION

The present invention relates to a recording material for the production of offset printing plates having a web- or plate-form support, a radiation-sensitive layer on the front of the support and a continuous layer on its back.

BACKGROUND OF THE INVENTION

Recording materials for the production of offset printing plates (also known as "pre-sensitized printing plates") are usually supplied in stacks of 20 units or more. Extended storage times, the action of pressure and/or elevated ambient temperatures frequently result in the plates adhering to one another. On removal of individual plates from the stack, scratches may then form on the front and/or back. The problem of undesired adhesion can be substantially eliminated with the aid of separating paper. The paper is particularly necessary in the case of recording materials having an aluminium support with an uncoated back. However, the separating paper results in new problems. The recording materials are frequently produced in in-line finishing plants, in which the plates are automatically cut to the desired size and packed. The separating paper is likewise inserted automatically. However, this step is relatively slow and susceptible to faults. In addition, the paper in some cases affects the radiation-sensitive layer and adversely changes its properties. This may result in discoloration of the layer, due to a change in the pH, a drop in its light sensitivity or rapid ageing. With surface-sealed papers, the interaction between paper and radiation-sensitive layer can be reduced; however, such papers are significantly more expensive. In relatively large print shops, the plate stacks provided with separating paper are generally processed in automatic plants, with the paper usually being blown out. This operation too is again relatively slow and susceptible to faults. In addition, the paper cannot be recycled and has to be disposed of.

The recording material described in JP-A 02/040657 manages without separating paper. A UV-cured layer produced from a photopolymerizable material is located on the back of its aluminium support. In addition to monomers, the composition used for the production of the back coating may also comprise photosensitizers, binders, fillers, inhibitors for preventing thermally induced polymerization of the monomers and other additives.

JP-A 06/202312 discloses a recording material for the production of offset printing plates whose aluminium support is likewise coated on the back with an organic polymer, such as polyethylene, polypropylene, polybutadiene, polyester, polycarbonate, polyvinyl acetal, polyvinyl chloride, polystyrene or a methacrylate resin. The back coating reduces attack by the aqueous-alkaline developer on the aluminium support. The light-sensitive layer in this recording material comprises from 1 to 10% by weight of a compound which is insoluble in the developer.

A recording material having an anodized aluminium support, a photopolymerizable layer on the aluminium oxide layer produced by anodization, and a back coating having a thickness of from 0.1 to 8.0 μm is disclosed in JP-A 09/265176. This back coating consists of a saturated copolymerized polyester resin, a phenoxy resin, a poly-vinyl acetal or a vinylidene chloride copolymer, each of which has a glass transition temperature $T_g$ of 20° C. or above. This is intended to prevent scratching of the plates during transport in the stack and delamination of the radiation-sensitive layer due to excessive adhesion to the back of the overlying plate.

A recording material for the production of offset printing plates which can be stacked without separating paper is also described in EP-A 528 395. It comprises a support (made of aluminium), a layer of an organic polymeric material having a glass transition temperature of not less than 20° C. with a thickness of from 0.01 to 8.0 μm on the back of the support, and a light-sensitive layer on the front of the support. A discontinuous matting layer consisting of particles having a mean diameter of not greater than 100 μm and a mean height of not greater than 10 μm is in turn located on the light-sensitive layer. However, matting layers, in particular those comprising a material having a low glass transition temperature, tend to stick to the back of the overlying plate in the stack. This may cause relatively large areas of the radiation-sensitive layer to be delaminated, meaning that the recording material can then no longer be used further.

A recording material having a matting layer on the radiation-sensitive layer and a further, likewise discontinuous matting layer on the back of the support material is disclosed in EP-A 883 028. The support material is generally an aluminium web having a length of up to several thousand meters and a thickness of about 0.2 mm which is generally rolled up again after the coating ("coil-to-coil process"). A higher pressure prevails in the interior of the roll than in the outer regions. This results in the matting layer located on the front being damaged to a non-uniformly great extent. A recording material having a greatly damaged matting layer requires longer evacuation times later in the contact copying frame. This problem is substantially solved by the additional matting layer on the back.

EP-A 490 515 relates to a pre-sensitized printing plate which, after imagewise exposure, is developed using an aqueous alkali metal silicate solution. In order to prevent the developer from dissolving aluminium out of the back of the plate, this is provided with an organic polymeric coating which is insoluble in the developer. The coating comprises polymers such as polyethylene, polypropylene, polybutene, polybutadiene, polyamide, polyurethane, polyurea, polyimide, polysiloxane, polycarbonate epoxy resins, polyvinyl chloride, polyvinylidene chloride or polystyrene. It may also comprise a thermally or photochemically curing component.

DE-A 199 08 529 describes a recording material having a support which has on the back a layer comprising an organic polymeric material having a glass transition temperature of 45° C. or above, and a pigmented light-sensitive layer located on the front of the support.

DE-A 100 29 157 relates to a recording material for the production of offset printing plates which has a dimensionally stable support, a radiation-sensitive layer located on the front of the support, and a layer which comprises an organic polymeric material and is resistant to processing chemicals located on the back of the support, where the glass transition temperature of the organic polymeric material is 35° C. or above, and the layer located on the back is pigmented.

The layer of recording materials known hitherto which is located on the back has high electrical surface resistance. It thus acts as an insulator, enabling electrostatic charges to build up. Since the back layer is advantageously applied before the image layer, it is necessary to dissipate any electrical charges present. The electrical charges may be residual charges (from the electrochemical treatment) and/or charges which form due to static charging during passage of the belt through the unit. Immediately after the electrochemical treatment, a radiation-sensitive mixture is applied to the pre-treated front of the support in the conventional in-line belt units. The mixture virtually always comprises readily volatile organic solvents which are explosive together with air. Static charges, which may result in ignition of a solvent vapour/air mixture, must therefore be avoided under all circumstances.

OBJECT OF THE INVENTION

The object of the invention was to modify the known back coatings in such a way that they are electrically conductive. In addition, if the back coating comes into contact with a radiation-sensitive layer, it should not adversely change the latter. In particular, the back coating should not stick to the radiation-sensitive layer or adhere so strongly that damage occurs on removal of the individual plates from the stack.

SUMMARY OF THE INVENTION

The object is achieved by a back coating which is electrically conductive. To this end, it generally comprises conductive, organic polymers or conductive pigments. In some cases, amphiphilic low-molecular-weight compounds are also sufficient.

The present invention thus relates to a recording material for the production of offset printing plates having a web- or plate-form support, a radiation-sensitive layer on the front of the support and a continuous layer on its back, which is characterized in that the layer located on the back has a glass transition temperature $T_g$ of 55° C. or above and an electrical surface resistance of $1 \cdot 10^6 \Omega$ (determined in accordance with DIN 53482 using a spring tongue electrode at 23° C. and 50% relative humidity) or less. The back coating may have a smooth or structured surface, depending on the nature of the electrically conductive component and the application method. The electrical conductivity is at least sufficiently large that the electrostatic charges which occur during electrochemical treatment of the support material can be dissipated.

As electrically conductive component, the back coating preferably comprises an electrically conductive polymer, such as polythiophene, polypyrrole, polyacetylene, polyaniline or poly(para-phenylene). The proportion of electrically conductive polymer(s) is generally from about 0.1 to 25% by weight, preferably from 0.5 to 10% by weight, in each case based on the total weight of the non-volatile constituents of the back coating.

Instead of or in addition to the electrically conductive polymer it is possible to use an electrically conductive pigment, such as a mica pigment coated with a metal (for example nickel) or metal oxide (for example antimony oxide or tin oxide), an aluminium pigment or carbon black. The proportion of electrically conductive pigments is generally from 1 to 25% by weight, preferably from 3 to 20% by weight, in each case based on the total weight of the non-volatile constituents of the back coating. Depending on the particle diameter, the pigments always produce a certain minimum roughness (Bekk value<500) of the surface of the back coating. By contrast, layers having a very smooth surface (Bekk value greater than 600) can also be produced with the electrically conductive polymers.

The electrical surface resistance of the back coating can be reduced to from about $1 \cdot 10^6$ to $1 \cdot 10^{-2} \Omega$, preferably from $1 \cdot 10^4$ to $1 \cdot 10^{-2} \Omega$, by means of the electrically conductive polymer and/or the electrically conductive pigment, depending on the nature and proportion of the additives.

For some cases, merely an amphiphilic, low-molecular-weight compound in the back coating is sufficient. This is, for example, an alkylsulfonate, an alkylarylsulfonate or -phosphonate, an ethoxylated alkylamine or a quaternary alkylamine. These compounds accumulate at the surface of the layer, where they result in the formation of an electrically conductive moisture film. However, these additives reduce the electrical surface resistance of the layer to only about $10^6 \Omega$. This embodiment is therefore generally less preferred. If the pre-sensitized printing plates are stored in stacks, the amphiphilic, low-molecular-weight compound may in addition diffuse out of the back layer of one plate into the image layer of the adjacent plate and impair the copying properties of the latter.

Besides the said constituents which provide for electrical conductivity, the back coating generally comprises an organic, polymeric material which is virtually insoluble in water and aqueous-alkaline developers. By means of this material, the glass transition temperature of the back coating is set to the requisite value of 55° C. or above. In one embodiment, the back coating is physically drying (i.e. not self-curing). Particularly suitable materials for a coating of this type are polyolefins (such as polyethylene, polypropylene, polybutylene, polybutadiene or polyisoprene), polyesters, polycarbonates, polyamides, polysiloxanes, polystyrene, homopolymers or copolymers of or with alkyl acrylate or alkyl methacrylate units (such as polymethyl methacrylate (PMMA) or styrene-methyl methacrylate copolymers), polyvinyl acetal, phenoxy resins (for example resins made from bisphenol A and epichlorohydrin), polyvinyl chloride (PVC) or polyvinylidene chloride (PVDC). If necessary, the layer may in addition comprise additives in secondary amounts. These include, for example, plasticizers, dyes, silicone compounds or surface-active agents. In the case of physically drying, non-self-curing back coatings, the organic polymeric material preferably has a glass transition temperature of 55° C. or above. In a further embodiment, the back coating is self-curing. In this case, besides the organic polymeric materials, it also comprises monomeric or oligomeric compounds which polymerize, condense or crosslink on exposure to radiation, heat and/or oxidizing agents and thus effect curing of the layer. Particularly suitable for this purpose are addition-polymerizable acrylates or methacrylates, such as ethyl (meth)acrylate, propyl (meth)acrylate, butyl (meth)acrylate, 2-hydroxyethyl (meth)acrylate, trimethylolpropane mono-, di- or tri(meth)acrylate or pentaerythritol tri(meth)acrylate. Also suitable are (meth)acrylamides, such as N-methyl-, N-ethyl-, N-propyl-, N-butyl- or N-isobutyl-(meth)acrylamide; furthermore allyl esters, such as allyl acetate; vinyl ethers, such as butyl vinyl ether, octyl vinyl ether, decyl vinyl ether, 2-methoxyethyl vinyl ether, diethylene glycol vinyl ether or benzyl vinyl ether; polyfunctional urethane acrylates which cure on exposure to UV radiation, and diisocyanate/diol mixtures which cure on exposure to heat to give polyurethanes.

In accordance with general practice, "(meth)acrylate" in the present application stands for "acrylate and/or methacrylate". A corresponding meaning applies to "(meth)acrylamide" and other derivatives of acrylic or methacrylic acid.

As described, the curing of the back coating may also be induced by actinic radiation, i.e. the back coating is in this case light-sensitive. For distinction therefrom, the radiation-sensitive layer on the front of the support is referred to as "image layer", since only this is exposed imagewise and developed.

The back coating is produced with the aid of generally known application methods and devices. Particularly suitable is firstly roller application. Use can be made here of smooth or engraved rollers which effect direct or indirect (offset) application, co-rotating or counter-rotating application. Also suitable is application with the aid of a counter-pressure roller or kiss coat. The electrically conductive back coating can have a smooth or structured surface.

The lacquer is initially located in a lacquer trough, from where it is applied to the support (which is preferably an aluminium web or an aluminium band having a thickness of from about 0.1 to 0.3 mm) by means of an uptake roller and an application roller. If necessary, one or more counter-rollers may also be employed here. Instead of an open lacquer trough, it is also possible to use a closed chamber doctor blade.

The structure here depends on the surface of the coating roller, the relative speeds of the rollers to one another and of the coating roller relative to the substrates. Depending on the magnitude of the speed difference between the application roller and the band, the lacquer structure created on the application roller is transferred to the band with little, if any, change. Of particular importance for this is of course the rheology of the lacquer, in particular its viscosity. The flow properties of the lacquer can be adjusted as required by warming the lacquer and/or the rollers and/or the band. In the case of transfer of a lacquer structure produced at elevated temperature onto an unheated band, the rapid lacquer cooling on the substrate ensures an increase in viscosity and thus fixing of the structures produced. Also of importance are the hardness of the rubber rollers employed and their contact pressure. Any structures desired can be produced both with surface-structured rollers and with smooth rollers. Structured rollers are known in various forms. Of these, particular mention should be made of engraved rollers. These can have recesses (pyramidal indents, hexagonal indents, etc.), line grids (hatched rollers), diagonal line grids or combinations thereof.

If a non-planar structure is desired, it can also be produced after the coating, or one that is already present can be subsequently changed. Thus, a structured surface can be smoothed using a distributor roller (for example a counter-rotating chrome roller). A longitudinally oriented line structure can be achieved using a structured roller or an attached coating bar (wire coating bar or grooved coating bar).

One lacquer structuring possibility that can be used is the viscosity dependence of the application temperature. By "quenching" of a lacquer warmed to above room temperature during application on an unheated band, the application structure can be retained until curing. By preheating the support material, the lacquer flow can be improved and the surface structure levelled.

The dimensionally stable, two-dimensional support can be produced from a multiplicity of materials. Suitable are, for example, supports made from plastic film (in particular polyester films, especially polyethylene terephthalate films), but preferably supports made from a metal or a metal alloy. Of these, preference is in turn given to supports made from aluminium or an aluminium alloy. The front of the aluminium support is advantageously mechanically and/or electrochemically roughened and/or anodically oxidized and, if necessary, additionally hydrophilized (for example by treatment with polyvinylphosphonic acid). However, further layers between the support and the image layer are likewise possible, for example hydrophilizing layers or priming layers. The support may also be provided with a layer of a ceramic material (additive graining). The thickness of the support is generally from 0.1 to 1.0 mm, preferably from 0.2 to 0.6 mm.

It is possible for the support provided with the back coating to be rolled up again ("coil-to-coil" process). Since the back is mechanically stable, it is virtually undamaged in the process, even in the interior of the roll, where the highest pressure prevails and the greatest forces act thereon.

Depending on the nature of their composition, the image layer may be sensitive to UV radiation, visible light and/or IR or heat radiation. The radiation-sensitive component in the image layer may, for example, be a diazonium salt, a combination of a photopolymerization initiator and a polymerizable monomer (in particular a monomer containing a polymerizable ethylenically unsaturated group), a combination of a compound which forms acid on irradiation, and a compound which can be cleaved by the photochemically generated acid. The image layer may additionally comprise IR dyes, carbon black and/or sensitizers.

Use is particularly frequently made in positive-working image layers of esters of a 1,2-naphthoquinone-2diazido-4- or -5-sulphonic acid and a compound containing at least one phenolic hydroxyl group. The last-mentioned compound preferably has at least 3 phenolic hydroxyl groups. Very particular preference is given for the esterification to compounds containing from 3 to 6 phenolic hydroxyl groups. Examples thereof are 2,3,4-trihydroxybenzophenone, 2,3,4-trihydroxy-3'-methyl-, -propyl- or -isopropylbenzophenone, 2,3,4,4'-tetra-hydroxybenzophenone, 2,3,4,2',4'-pentahydroxybenzo-phenone, 2,3,4,2',3',4'-hexahydroxybenzophenone and 5,5'-diacyl-2,3,4,2',3',4'-hexahydroxydiphenylmethane. In general, not all the phenolic hydroxyl groups therein are esterified. The degree of esterification, based on all hydroxyl groups, is typically from 60 to 95%. Amides of 1,2-naphthoquinone-2-diazido-4- or -5-sulphonic acid are likewise suitable. Esterification components which can be used are also products of the condensation of pyrogallol and aldehydes or ketones and products of the condensation of alkylated phenol and formaldehyde. The content of radiation-sensitive compounds is from about 1 to 50% by weight, based on the total weight of the non-volatile constituents of the mixture. Image layers comprising naphthoquinonediazidosulphonic acid esters or -sulfonamides as radiation-sensitive component are particularly sensitive to UV and visible light.

Positive-working image layers which are insensitive to UV radiation and visible light, but can be imaged by IR or heat radiation are likewise known (EP-A 900 653). The layer comprises, as radiation-sensitive components, carbon black particles or a dye in disperse form which is sensitive in the IR region. IR radiation, in particular IR laser radiation, effects imagewise differentiation in the layer, enabling the irradiated areas to be removed by a developer.

It is also possible to use recording materials having a positive-working image layer which comprises a combination of a compound containing at least one C—O—C bond which can be broken by acid and a compound which forms a strong acid on exposure to actinic radiation. Layers of this type are known to the person skilled in the art and are described in large number, for example EP-A 717 317.

Besides a polymeric binder, photopolymerizable image layers usually comprise a free-radical-polymerizable component (monomer) and an initiator which is capable of initiating polymerization of the monomer on exposure to actinic radiation. The initiator is, for example, a combination of a photoreducible dye and a metallocene, in particularly a titanocene. The monomers frequently contain free-radical-polymerizable acrylate or methacrylate groups. The light sensitivity of such layers can be increased still further by employing monomers containing at least one photooxidizable group or additionally onium compounds, in particular iodonium or sulphonium salts. Photopolymerizable layers are impaired by atmospheric oxygen. They are therefore often protected by a cover layer which is relatively impermeable to oxygen, but which can be removed completely again by aqueous developers.

The image layer may also comprise silver halide as the radiation-sensitive component. It then includes a silver halide emulsion layer. Preference is given to image layers which work by the silver complex diffusion transfer reversal process (abbreviated to DTR process). It then consists of two or more part layers, as described in greater detail in EP-A 410 500, 423 399 or 883 027. The lowermost, i.e. closest to the support, is usually a receiving layer comprising silver nuclei. The nuclei initiate the development of the silver complexes that have diffused in, giving a silver image when a suitable developer acts thereon. The development nuclei are preferably produced by application of colloidal silver, gold, platinum, palladium or other metals. They may furthermore consist of heavy-metal sulphides or selenides, for example sulphides of antimony, bismuth, cadmium, cobalt, lead, nickel, palladium, platinum, silver or zinc. Palladium sulphide and the nickel/silver sulphide $NiS.Ag_2S$ described in U.S. Pat. No. 4,563,410 are particularly suitable. Also suitable are polyselenides or polysulphides of heavy metals. In addition, dyes or pigments may be present as antihalo agents, either as a constituent of the nucleus layer or in a separate layer. The type of dye or pigment depends on the region of the spectrum in which the silver halide emulsion layer is sensitive. The nucleus layer is very thin (generally less than 0.5 µm); it normally contains no binder. As already described, the nucleus layer is not absolutely necessary. If no such layer is present, constituents of the metallic support take on the role of the development nuclei. Finally, it is also possible to arrange the image receiving layer or nucleus layer on a separate support. DTR materials of this type consisting of two elements are known in principle.

A thin, silver-free interlayer, for example a layer of pigment and a hydrophilic, film-forming polymer, for example polyvinyl alcohol or pullulane, is located above the receiving layer. The next is a silver halide emulsion layer. The silver halide is, for example, silver chloride, bromide, bromoiodide, chlorobromoiodide or a mixture thereof. The silver halide advantageously comprises more than 90% by weight, based on the total weight of the silver halides, of silver chloride. In addition, small amounts of silver chloroiodide and/or silver bromide are frequently also present. The silver halide particles in the emulsion layer normally have a mean size of from 0.05 to 1.0 µm, preferably from 0.25 to 0.45 µm. They can also be produced by the core of the particles having a different composition than the shell. Silver bromide is frequently located exclusively in the core. The binders used for this layer are generally hydrophilic colloids, preferably gelatine. The gelatine is advantageously not hardened. Instead of or in addition to the gelatine, it is also possible to employ other polymers, for example polyvinyl alcohol, polyvinylpyrrolidone, polyvinylimidazole, poly(meth)acrylamide, polyacrylic acid, cellulose or cellulose derivatives (particularly cellulose ethers, such as hydroxyalkyl- or carboxymethylcellulose), starch or alginates. Finally, the emulsion layer may also comprise dyes in order to adjust the spectral sensitivity of the silver halide layer and/or in order to prevent undesired light scattering. These are, for example, methine, cyanine or hemicyanine dyes. Finally, the silver halide layer may comprise conventional emulsion stabilizers, for example azaindenes, especially tetra- or pentaazaindenes. The azaindenes are preferably substituted by amino or hydroxyl groups. An example of a substituted azaindene of this type is 4-hydroxy-6-methyl-1,3,3a,7-tetraazaindene. Other suitable stabilizers are quaternized benzothiazoles, benzotriazoles and heterocyclic mercapto compounds, for example mercapto-substituted tetrazoles and pyrimidines. An example of a tetrazole of this type is 1-[3-(2-sulphobenzoylamino)phenyl]-5-mercaptotetrazole.

In a preferred embodiment, a protective layer may also be located on the silver halide emulsion layer. It generally has a weight of from 0.50 to 1.75 $g/m^2$ preferably from 0.60 to 1.20 $g/m^2$ and advantageously consists of unhardened gelatine (a 10% strength by weight aqueous solution of the gelatine has a viscosity of preferably less than 20 mPa·s at 40° C. and at pH 6). The cover layer may in turn comprise dyes and/or coloured pigments and/or matting agents. The matting agent here generally consists of particles having a mean diameter of from 0.2 to 10 µm, preferably from 0.5 to 6.0 µm.

Negative-working layers which are provided for imaging with UV or visible light in many cases comprise diazonium salt polycondensation products. These are, in particular, products of the condensation of aromatic diazonium salts. Condensation products of this type are known, inter alia, from DE-A 12 14 086 (=U.S. Pat. No. 3,235,384). They are generally prepared by condensation of a polycyclic aromatic diazonium compound, preferably of substituted or unsubstituted diphenylamine-4-diazonium salts with active carbonyl compounds, preferably formaldehyde, in a strongly acidic medium, preferably concentrated phosphoric acid.

The image layer may also be imaged by an electrophotographic principle. In this case, it usually comprises a photoconductive layer comprising an organic photoconductor on an electrically conductive support.

In addition to the radiation-sensitive component, the image layer usually also comprises a polymeric, organic binder. Preference is given to phenolformaldehyde condensates, where the term "phenol" here is also taken to mean substituted phenols, such as resorcinol, cresol, xylenol, and the like. Besides or in addition to the formaldehyde, it is also possible to employ other aldehydes or also ketones as condensation partner. Also suitable are products of the reaction of diisocyanates with diols or diamines, in particular those containing acid groups. Mention should also be made of polymers containing units of vinylaromatic compounds, N-aryl-(meth)acrylamides or aryl (meth)acrylates, where these units in each case also contain one or more carboxyl group(s), phenolic hydroxyl groups, sulphamoyl or carbamoyl groups, as well as copolymers containing units of N-substituted maleimidobenzenesulfonamides.

If the recording material according to the invention is pigmented or matted on the front, the Bekk smoothness of the surface on this side is generally less than 600 s, preferably from 100 to 150 s.

The further processing (imagewise exposure or irradiation, development, etc.) for the recording materials according to the invention is carried out virtually in the same way as for recording materials without back coatings. Since the back coating is resistant to processing chemicals, it also prevents attack by the developer on the support. This is particularly important in the case of aluminium supports.

These are attacked by alkaline developers, in particular by strongly alkaline developers, which increases the developer load and thus reduces its service life.

The following examples serve to illustrate the invention. pbw therein stands for part(s) by weight. Percentages are per cent by weight, unless otherwise stated.

In the examples, the methods known from DE-A 100 63 591 are employed for producing the back coating:

Back Coatings:

R1: 80 pbw of a multifunctional acrylate monomer (®Laromer LR8986 from BASF AG)
  20 pbw of a multifunctional acrylate monomer (®Laromer DPGDA from BASF AG)
  3 pbw of a 20% strength solution of cellulose acetobutyrate in tripropylene glycol diacrylate (TPGDA) (CAB 551-0.2 from BASF AG)
  2 pbw of multifunctional acrylate monomer (®Ebecryl 170 from UCB S.A.)
  4 pbw of 2-hydroxy-2-methyl-1-phenylpropan-1-one as photoinitiator (®Darocur 1173 from Ciba Specialty Chemicals) and
  15 pbw of 3,4-polyethylenedioxythiophene (®Baytron P from Bayer AG)
  were applied by roller application (by means of indirect counterrotating rollers) in such a way as to give a wet film having a weight of 3 g/m². The wet film was subsequently exposed for 20 s under a 160 W/cm mercury vapour lamp.

R2: 80 pbw of a multifunctional acrylate monomer (®Laromer LR8986 from BASF AG)
  20 pbw of a multifunctional acrylate monomer (®Laromer DPGDA from BASF AG)
  2 pbw of multifunctional acrylate monomer (®Ebecryl 170 from UCB S.A.)
  4 pbw of 2-hydroxy-2-methyl-1-phenylpropan-1-one as photoinitiator (®Darocur 1173 from Ciba Specialty Chemicals) and
  9 pbw of polypyrrole/polyurethane pigment (®Conquest XP 1020 from DSM N.V.)
  were applied by roller application (in direct application, by means of co-rotating rollers or by means of distributing rollers) in such a way as to give a wet film having a weight of 5 g/m². The wet film was subsequently exposed for 20 s under a 160 W/cm mercury vapour lamp.

R3: 15 pbw of polyurethane (®Desmodur 2170 from Bayer AG),
  3 pbw of aluminium pigment (mean particle size 20 μm) and
  82 pbw of N-methylpyrrolidone
  were applied by flow coating and dried at a dryer temperature of 180° C. for 1 minute, giving a layer having a weight of 21 g/m².

R4: 9.6 pbw of polyether sulphone (®Ultrason 6010 from BASF AG)
  2.4 pbw of a pigment comprising 43% of (Sn/Sb)O₂ and 57% of mica having a mean particle size of 15 μm (®Minatec 40 CM from Merck KGaA) and
  88 pbw of N-methylpyrrolidone
  were applied by roller application (indirect counterrolling) and dried at a dryer temperature of 150° C., giving a layer having a weight of 9 g/m².

R5: 10 pbw of acrylonitrile-styrene copolymer having an acrylonitrile content of 45%,
  1.3 pbw of a polyacetylene having a molecular weight of 100,000, and
  98.7 pbw of N,N-dimethylacetamide
  were applied by flow coater application and dried at a dryer temperature of 170° C., giving a layer having a weight of 16 g/m².

R6: 80 pbw of a multifunctional acrylate monomer (®Laromer LR8986 from BASF AG),
  20 pbw of a multifunctional acrylate monomer (®Laromer DPGDA from BASF AG),
  3 pbw of a 20% strength solution of cellulose acetobutyrate in tripropylene glycol diacrylate (TPGDA) (CAB 551-0.2 from BASF AG),
  2 pbw of multifunctional acrylate monomer (®Ebecryl 170 from UCB S.A.),
  4 pbw of 2-hydroxy-2-methyl-1-phenylpropan-1-one as photoinitiator (®Darocur 1173 from Ciba Specialty Chemicals) and
  8 pbw of nonylphenol phosphonate (®Stepfac 8171 from Stepan Co.)
  were applied by roller application (with engraved rollers by the direct co-running method) in such a way so as to give a wet film having a weight of 4 g/m². The wet film was subsequently exposed for 20 seconds under a 160 W/cm mercury vapour lamp.

R7: 15 pbw of polyurethane (®Desmodur 2170 from Bayer AG) and
  85 pbw of butan-2-one
  were applied by roller coater application and dried at a dryer temperature of 150° C., giving a layer having a thickness of 13 g/m².

Front Coatings:

P1: 7.8 pbw of a cresol-formaldehyde novolak having a hydroxyl number of 420 in accordance with DIN 53783/53240 and a mean molecular weight, determined by gel permeation chromatography, of 6000 (polystyrene standard),
  3.2 pbw of a product of the esterification of 1.5 mol of 1,2-naphthoquinone-2-diazido-5-sulphonyl chloride and 1 mol of 2,3,4-trihydroxybenzophenone,
  0.4 pbw of 1,2-naphthoquinone-2-diazido-5-sulphonyl chloride,
  0.2 pbw of Victoria Pure Blue (Colour Index 44045), to 100 pbw of a solvent mixture of THF and 1-methoxypropan-2-ol (50:50)
Layer Weight: 2 g/m²

P2: 7.8 pbw of a cresol-formaldehyde novolak having a hydroxyl number of 420 in accordance with DIN 53783/53240 and a mean molecular weight by GPC of 6000 (polystyrene standard),
  3.2 pbw of a product of the esterification of 1.5 mol of 1,2-naphthoquinone-2-diazido-5-sulphonyl chloride and 1 mol of 2,3,4-trihydroxybenzophenone,
  0.4 pbw of 1,2-naphthoquinone-2-diazido-5-sulphonyl chloride,
  0.2 pbw of Victoria Pure Blue (C. I. 44045),
  0.1 pbw of a silica gel filler having a mean particle size of 4 μm,
  to 100 pbw of a solvent mixture of THF and 1-methoxypropan-2-ol (50:50)
Layer Weight 2 g/m²

P3: 4.5 pbw of a product of the esterification of 1,2-diazonaphthoquinone-5-sulphonyl chloride and a pyrogallol-acetone resin (see Example 1 of U.S. Pat. No. 3,635,709),
  11.0 pbw of a cresol-formaldehyde novolak resin,
  0.2 pbw of 2-(4-methoxyphenyl)-4,6-bis(trichloromethyl)-s-triazine, 0.1 pbw of Oil Blue #603 (Orient Chemical Industries Co. Ltd.),
0.04 pbw of fluorosurfactant (®Megafac F-177 from Dainippon Ink and Chemicals),
100.00 pbw of butan-2-one,
100.00 pbw of propylene glycol monomethyl ether.
Layer Weight 2.0 g/m²

This layer was dried for 1 minute at 100° C. A matting layer was subsequently applied as follows:

An MMA-ethyl acrylate-acrylic acid copolymer (weight ratio 65:20:15) which had been partially neutralized (sodium, potassium or ammonium salt) was dissolved in water to give a 12% strength solution. This solution was applied using a rotating electrostatic spray device (speed of the spray head 25,000 rpm). 40 ml/min were sprayed with the voltage at the spray head being −90 kV. The spray process was carried out at 25° C. and 50% atmospheric humidity. 2.5 seconds after spraying with the copolymer solution, the copy layer was sprayed with steam and then dried for 5 seconds using hot air (60° C., 10% relative atmospheric humidity). Elevations were formed on the matting layer with an average height of 6 μm and an extension of 30 μm. The mean thickness of the matting layer was 0.15 g/m².

P4: 7.8 pbw of a cresol-formaldehyde novolak having a hydroxyl number of 420 in accordance with DIN 53783/53240 and a mean molecular weight by GPC of 6000 (polystyrene standard),
3.2 pbw of a product of the esterification of 1.5 mol of 1,2-naphthoquinone-2-diazido-5-sulphonyl chloride and 1 mol of 2,3,4-trihydroxybenzophenone,
0.4 pbw of 1,2-naphthoquinone-2-diazido-5-sulphonyl chloride,
0.2 pbw Victoria Pure Blue (C.I. 44045),
to 100 pbw of a solvent mixture of tetrahydrofuran (THF) and 1-methoxypropan-2-ol (50:50)

This layer was dried for 1 minute at 100° C. The layer weight was then determined at 1.9 g/m². A matting layer was applied as follows:

An electrostatic spray device with a capillary was charged with a solution comprising 35% of a cresol-formaldehyde resin and 65% of ethylene glycol ethyl ether acetate (2-ethoxyethanol acetate). The conductivity of the solution was 1.2×10⁷ pS m⁻¹. A voltage of −30 kV was applied. The coating was then carried out at a temperature of 30° C. from a distance of 300 mm from the coated plate at a spray rate of 0.70 cm³. In this way, a discontinuous layer was obtained whose particles had a diameter of from about 30 to 40 μm and did not penetrate through the copy layer.

P5: 4.70 pbw of a cresol-formaldehyde novolak having a hydroxyl number of 420 in accordance with DIN 53783/53240 and a mean molecular weight by GPC of 6000 (polystyrene standard),
1.90 pbw of a polyacetal made from 2-ethylbutyraldehyde and triethylene glycol,
0.23 pbw of 2-(4-styrylphenyl)-4,6-bistrichloromethyl-s-triazine,
0.02 pbw of Crystal Violet,
0.10 pbw of a silica gel filler having a mean particle size of 4 μm,
to 100.00 pbw of a solvent mixture of butan-2-one and ethylene glycol monomethyl ether (90:10).

The layer produced from the mixture had a weight of 1.9 g/m²

N1: 62.00 pbw of a maleic anhydride-functionalized polyvinylbutyral having a molecular weight $M_w$=about 80,000 which contains 71% of vinylbutyral, 2% of vinyl acetate and 27% of vinyl alcohol units,
21.00 pbw of a diazonium salt polycondensation product prepared from 1 mol of 3-methoxy-diphenylamine-4-diazonium sulphate and a 4,4'-bismethoxymethyldiphenyl ether in 85% strength phosphoric acid, isolated as mesitylene sulphonate,
2.50 pbw of phosphoric acid,
3.00 pbw of Victoria Pure Blue FGA (C.I. Basic Blue 81),
0.70 pbw of phenylazodiphenylamine,
2570 pbw of ethylene glycol monomethyl ether and
780 pbw of butan-2-one.

N2: as N1, but where the mixture additionally contained 0.10 pbw of a silica gel filler having a mean particle size of 3 μm, N3: as N1, but with an additional matting layer applied as follows:

A methyl methacrylate (MMA)-ethyl acrylate-acrylic acid copolymer (weight ratio 65:20:15) which had been partially neutralized (sodium, potassium or ammonium salt) is dissolved in water (12% strength by weight). This solution was applied using a rotating electrostatic spray device (speed of the spray head 25,000 rpm). 40 ml/min were sprayed, with the voltage at the spray head being −90 kV. The spray process was carried out at 25° C. and 50% atmospheric humidity. 2.5 seconds after spraying with the copolymer solution, the copy layer was sprayed with steam and then dried for 5 seconds using hot air (60° C., 10% relative atmospheric humidity). Elevations were formed on the matting layer with an average height of 6 μm and an extension of 30 μm. The mean thickness of the matting layer is 0.15 g/m².

The layer weight of the dried layers N1 to N3 was in each case 0.9 g/m² (in the case of layer N3 before application of the matting layer).

N4: 4.50 pbw of a copolymer of maleic anhydride and methyl methacrylate having an acid number of from 100 to 120 and a mean molecular weight $M_w$=100,000,
2.00 pbw of a urethane acrylate (®Plex 6661 from Röhm AG),
3.00 pbw of a product of the reaction of 1 mol of hexamethylenediamine with 2 mol of hydroxyethyl methacrylate,
0.35 pbw of phenylacridine,
0.10 pbw of Leuko Crystal Violet,
0.05 pbw of Crystal Violet,
to 100.00 pbw of a mixture of propylene glycol monomethyl ether (®Dowanol) and butan-2-one (70:30).

After drying, the layer weight was 1.0 g/m². A water-soluble cover layer was applied to this radiation-sensitive layer. To this end, the following coating solution was used:
7.00 pbw of a polyvinyl alcohol containing 12% of acetate groups,
0.01 pbw of a fatty alcohol ethoxylate having 8 ethylene oxide units,
to 100.00 pbw of water.

The weight of the cover layer after drying was 2.0 g/m².

T1: 9.70 pbw of a cresol-formaldehyde novolak having a hydroxyl number of 420 in accordance with DIN 53783/53240 and a mean molecular weight by GPC of 6000 (polystyrene standard),
0.80 pbw of poly(4-hydroxystyrene) having an $M_w$ of from 4000 to 6000 and an $M_n$ of from 2100 to 3100 (®Maruka Lyncur M, grade S2 from Maruzen Petrochemical Co., Ltd.),
8.00 pbw of a carbon black dispersion comprising 5.00 pbw of carbon black (special black from Degussa AG), 66.00 pbw of the above-described novolak (30% strength in γ-butyrolactone), 28.99 pbw of γ-butyrolactone and 0.01 pbw of silicone antifoam (RC31 from Agfa-Gevaert AG),
40.00 pbw of propylene glycol monomethyl ether,
31.00 pbw of acetone and
10.50 pbw of γ-butyrolactone.

T2: 9.00 pbw of polystyrene latex having a mean particle size of 2 μm (25% strength in water), prepared by emulsion polymerization
27.10 pbw of an anionic cyanine dye, 2-[2-(2-chloro-3-{2-[1,1-dimethyl-3-(2-sulfoethyl)-1,3-dihydrobenzo[e]indol-2-ylidene]ethylidene}-cyclohex-1-enyl)vinyl]-(1,1-dimethyl-1H-benzo[e]indolium-3-yl] ethanesulfonate (triethylammonium salt), see formula (I) in EP-A 908 305
27.00 pbw of a polyacrylic acid having a mean molecular weight of 500,000 (determined by GPC in N,N-dimethylacetamide (DMAC) using PMMA standards)
0.50 pbw of fluorosurfactant (®MegaFac F-177 from Dainippon Ink & Chemicals)
to 100 pbw of demineralized water was applied in such a way as to give a layer of 2 g/m².

A1: Firstly, a nucleus layer comprising 2.3 mg of silver nuclei (prepared from colloidal silver) was produced. An interlayer comprising a mixture of binder (pullulan) and coloured pigment (®Levanyl Red dispersion) was applied to this nucleus layer. The interlayer comprised 0.1 g/m² of pullulan and 0.2 g/m² of Levanyl Red dispersion.

An unhardened, negative-working, cadmium-free gelatine/silver chloroiodide emulsion (weight ratio 99.75:0.25) was then applied to the interlayer. This layer furthermore comprised 1 mmol of 4-hydroxy-6-methyl-1,3,3a,7-tetraazaindene and 2.2 mmol of 1-[3-(2-sulfobenzoylamino)phenyl]-5-mercaptotetrazole per mole of AgX. The silver halide was applied in an amount which corresponded to 2.4 g/m² of silver nitrate. The gelatine was applied in an amount of 1.6 g/m². The gelatine comprised two different types, one of which had a viscosity of 21 mPa·s (0.7 g/m²) and the other had a viscosity of 14 mPa·s (0.9 g/m²).

Finally, a cover layer comprising 0.7 g/m² of gelatine having a viscosity of between 10 and 12 mPa·s, 0.1 g/m² of Levanyl Red dispersion and 0.12 g/m² of a matting agent having a particle diameter of 7.5 μm was applied to the silver halide emulsion layer.

E1: 6.50 pbw of styrene-MA copolymer (styrene/MA= 1.4) having a mean molecular weight $M_w$ of 100,000,
4.00 pbw of 2,5-bis(4-diethylaminophenyl)-[1,3,4]-oxa-diazole,
0.02 pbw of Rhodamine FB (C.I. 45170) and
0.02 pbw of acriflavin in
45.00 pbw of acetone and
45.00 pbw of γ-butyrolactone.

None of the examples exhibited differences in copying performance before the storage test compared with plates without a back coating. For comparison, an example without a back coating was recorded (R8 V*).

Test 1:
Electrical surface resistance of the back coating (determined in accordance with DIN 53422 using a spring tongue electrode at 23° C. and 50% relative humidity):
− surface resistance greater than $1·10^8 \Omega$
0 surface resistance from $1·10^6$ to $1·10^8 \Omega$
+ surface resistance less than $1·10^6 \Omega$ Test 2:
Assessment of the copying performance after storage with exposure to high pressure (stacks with 100 plates measuring 600×800 mm, with the stack additionally being loaded with a total weight of 50 kg; storage conditions: 2 weeks at 50° C. and 50% relative atmospheric humidity; plates without a back coating had scratches or stuck together after storage, although this was not assessed separately here):
− areas of tone
0 individual ink-accepting dots in non-image areas
+ no impairment of the copying properties The test results are summarized in the following table:

| Front | Test | R1 | R2 | R3 | R4 | R5 | R6 | R7 | R8V* |
|---|---|---|---|---|---|---|---|---|---|
| P1 | 1 | + | + | + | + | + | 0 | − | + |
|    | 2 | + | + | + | + | + | + | + | + |
| P2 | 1 | + | + | + | + | + | 0 | − | + |
|    | 2 | + | + | + | + | + | + | + | + |
| P3 | 1 | + | + | + | + | + | 0 | − | + |
|    | 2 | + | + | + | + | + | + | + | + |
| P4 | 1 | + | + | + | + | + | 0 | − | + |
|    | 2 | + | + | + | + |   |   |   |   |
| P5 | 1 | + | + | + | + | + | 0 | − | + |
|    | 2 |   | + | + | + | + | + | + | + |
| N1 | 1 | + | + | + | + | + | 0 | − | + |
|    | 2 | + | + | + | + | + | + | + | + |
| N2 | 1 | + | + | + | + | + | 0 | − | + |
|    | 2 | + | + | + | + | + | + | + | + |
| N3 | 1 | + | + | + | + | + | 0 | − | + |
|    | 2 | + | + | + | + |   | + | + | + |
| N4 | 1 | + | + | + | + | + | + | − | + |
|    | 2 | + | + | + | + | + | 0 | + | + |
| T1 | 1 | + | + | + | + | + | 0 | − | + |
|    | 2 | + | + | + | + | + | 0 | + | + |
| T2 | 1 | + | + | + | + | + | 0 | − | + |
|    | 2 | + | + | + | + | + | 0 | + | + |
| A1 | 1 | + | + | + | + | + | 0 | − | + |
|    | 2 | + | + | + | + | + | − | + | + |
| E1 | 1 | + | + | + | + | + | 0 | − | + |
|    | 2 | + | + | + | + | + | + | + | + |

What is claimed is:

1. A recording material for the production of offset printing plates, which comprises a web-form support or plate-form support having a front and a back, a radiation-sensitive layer on the front of said support and a continuous layer on said back of said support, wherein the layer located on the back has a glass transition temperature $T_g$ of at least 55° C. and a surface resistance of $10^6 \Omega$ or less (determined in accordance with DIN 53482 using a spring tongue electrode at 23° C. and 50% relative humidity).

2. The recording material according to claim 1, wherein the layer located on the back has a surface resistance of from $10^4$ to $10^{-2} \Omega$.

3. The recording material according to claim 1, wherein the layer located on the back comprises at least one electrically conductive polymer.

4. The recording material according to claim 3, wherein the amount of the at least one electrically conductive polymer is from 0.1 to 25% by weight, based on the total weight of the non-volatile constituents of the layer.

5. The recording material according to claim 1, wherein the layer located on the back comprises at least one electrically conductive pigment.

6. The recording material according to claim 5, wherein the amount of the at least one electrically conductive pigment is from 1 to 25% by weight, based on the total weight of the non-volatile constituents of the back coating.

7. The recording material according to claim 1, wherein the layer located on the back is not a self-crosslinking layer.

8. The recording material according to claim 1, wherein the layer located on the back is crosslinked by exposure to heat and/or UV radiation.

9. The recording material according to claim 1, wherein the layer located on the back has a smooth surface structure having Bekk value greater than 600.

10. The recording material according to claim 1, wherein the layer located on the back has a rough surface structure having a Bekk value from 10 to 500.

11. The recording material according to claim 1, wherein the radiation-sensitive layer located on the front of the support is positive-working.

12. The recording material according to claim 1, wherein the radiation-sensitive layer located on the front of the support is negative-working.

13. The recording material according to claim 1, wherein the radiation-sensitive layer located on the front of the support works on the basis of silver halide.

14. The recording material according to claim 1, wherein the radiation-sensitive layer located on the front of the support is thermally positive-working or thermally negative-working.

15. The recording material according to claim 2, wherein the layer located on the back comprises at least one electrically conductive polymer selected from the group consisting of polythiophene, polypyrrole, polyacetylene, polyaniline and poly(para-phenylene).

16. The recording material according to claim 15, wherein the amount of the at least one electrically conductive polymer is from 0.5 to 10% by weight based on the total weight of the non-volatile constituents of the layer.

17. The recording material according to claim 2, wherein the layer located on the back comprises a mica pigment coated with a metal or metal oxide, an aluminum pigment or carbon black.

18. The recording material according to claim 17, wherein the mica pigment is from 3 to 20% by weight based on the total weight of the non-volatile constituents of the back coating.

19. The recording material according to claim 1, wherein the electrically conductive pigment is selected from the group consisting of a mica pigment coated with a metal or metal oxide, an aluminium pigment or carbon black.

* * * * *